(12) United States Patent
Zheng et al.

(10) Patent No.: US 12,334,013 B2
(45) Date of Patent: Jun. 17, 2025

(54) DISPLAY PANEL AND DISPLAY APPARATUS

(71) Applicants: Chengdu BOE Optoelectronics Technology Co., Ltd., Sichuan (CN); BOE Technology Group Co., Ltd., Beijing (CN)

(72) Inventors: Kening Zheng, Beijing (CN); Xueguang Hao, Beijing (CN); Xing Yao, Beijing (CN)

(73) Assignees: Chengdu BOE Optoelectronics Technology Co., Ltd., Sichuan (CN); BOE Technology Group Co., Ltd., Beijing (CN)

( * ) Notice: Subject to any disclaimer, the term of this patent is extended or adjusted under 35 U.S.C. 154(b) by 0 days.

(21) Appl. No.: 18/288,454

(22) PCT Filed: Dec. 15, 2022

(86) PCT No.: PCT/CN2022/139222
§ 371 (c)(1),
(2) Date: Oct. 26, 2023

(87) PCT Pub. No.: WO2024/124469
PCT Pub. Date: Jun. 20, 2024

(65) Prior Publication Data
US 2025/0087149 A1   Mar. 13, 2025

(51) Int. Cl.
*G09G 3/3233*   (2016.01)

(52) U.S. Cl.
CPC ....... *G09G 3/3233* (2013.01); *G09G 2310/08* (2013.01); *G09G 2320/041* (2013.01); *G09G 2320/0666* (2013.01)

(58) Field of Classification Search
CPC ............. G09G 3/3233; G09G 2310/08; G09G 2320/041; G09G 2320/0666
See application file for complete search history.

(56) References Cited

U.S. PATENT DOCUMENTS

2017/0077200 A1* 3/2017 Mou ................... H10K 50/165
2018/0374829 A1* 12/2018 Henley ............... H01L 25/0753
(Continued)

FOREIGN PATENT DOCUMENTS

CN   102163402 A   8/2011
CN   102651454 A   8/2012
(Continued)

OTHER PUBLICATIONS

European Patent Office, Supplementary Partial European Search Report, May 12, 2025, for corresponding EP application No. 22968179.6.

*Primary Examiner* — Lisa S Landis
(74) *Attorney, Agent, or Firm* — HOUTTEMAN LAW LLC

(57) ABSTRACT

The present disclosure provides a display panel and a display apparatus, and belongs to the field of display technology, and can solve the problem of the color shift easily occurring in the high-temperature reliability test in the related display panel. The display panel of the present disclosure includes: a plurality of sub-pixel units and a voltage control module; each sub-pixel unit includes: a light emitting device; and the voltage control module is connected to an anode of the corresponding light emitting device, and is configured to control an anode voltage of the corresponding light emitting device, so that a ratio of the number of electrons to the number of holes of the light emitting device is unchanged at different gray scales.

20 Claims, 9 Drawing Sheets

(56) References Cited

U.S. PATENT DOCUMENTS

| | | |
|---|---|---|
| 2019/0036033 A1 | 1/2019 | Nakanotani et al. |
| 2022/0091418 A1* | 3/2022 | Choi .................. G06F 3/013 |
| 2022/0199931 A1 | 6/2022 | Hamer et al. |
| 2022/0208099 A1 | 6/2022 | Liu et al. |

FOREIGN PATENT DOCUMENTS

| | | |
|---|---|---|
| CN | 104464618 A | 3/2015 |
| CN | 105280684 A | 1/2016 |
| CN | 106255277 A | 12/2016 |
| CN | 106910461 A | 6/2017 |
| CN | 108230996 A | 6/2018 |
| CN | 108448003 A | 8/2018 |
| CN | 108899343 A | 11/2018 |
| CN | 110854282 A | 2/2020 |
| CN | 111740021 A | 10/2020 |
| CN | 112599099 A | 4/2021 |
| CN | 112952013 A | 6/2021 |
| CN | 113851595 A | 12/2021 |
| CN | 114023256 A | 2/2022 |
| CN | 114724519 A | 7/2022 |
| CN | 114743507 A | 7/2022 |
| CN | 115331626 A | 11/2022 |
| JP | 2008191295 A | 8/2008 |
| JP | 2008233125 A | 10/2008 |
| JP | 2008292785 A | 12/2008 |
| JP | 2009116115 A | 5/2009 |

* cited by examiner

DISPLAY PANEL AND DISPLAY APPARATUS

TECHNICAL FIELD

The present disclosure relates to the field of display technology, and in particular to a display panel and a display apparatus.

BACKGROUND

An organic light emitting diode (OLED) is a light emitting device with an organic solid semiconductor used as a light emitting material, and has a wide application prospect due to its advantages of a simple manufacturing process, a low cost, a low power consumption, a high brightness, a wide operating-temperature range, and the like.

As the display products can be used in more application scenes, different environments and different temperatures have increasingly large influence on display pictures, and users also have increasingly strict requirements on the display pictures (particularly low-gray-scale display pictures). In the OLED light emitting device, electrons and holes are injected into a light emitting layer from a cathode and an anode, respectively, and are recombined in the light emitting layer to emit light. The temperature has a large influence on the OLED light emitting device. In a high-temperature reliability test, the light emitting layer in the OLED device is irreversibly changed easily, which easily causes a color shift and affects the display effect.

SUMMARY

The present disclosure is directed to at least one of the technical problems in the prior art, and provides a display panel and a display apparatus.

In a first aspect, embodiments of the present disclosure provide a display panel, including: a plurality of sub-pixel units and a voltage control module; wherein each sub-pixel unit includes: a light emitting device; and wherein the voltage control module is connected to an anode of the corresponding light emitting device, and is configured to control an anode voltage of the corresponding light emitting device, so that a ratio of the number of electrons to the number of holes of each light emitting device is unchanged at different gray scales.

In some examples, the anode voltage is a pulse signal with a first voltage and a second voltage which are alternated; and a first voltage duration and a second voltage duration of the anode voltage are different in the plurality of sub-pixel units with different colors.

In some examples, the plurality of sub-pixel units include: a red sub-pixel unit, a green sub-pixel unit and a blue sub-pixel unit; in the red sub-pixel unit, the first voltage duration of the anode voltage is 2.9 to 3.1 times of the second voltage duration; in the green sub-pixel unit, the first voltage duration of the anode voltage is 0.9 to 1.1 times of the second voltage duration; and in the blue sub-pixel unit, the first voltage duration of the anode voltage is 1.2 to 1.4 times of the second voltage duration.

In some examples, the anode voltage is a pulse signal with a second voltage and a first voltage which are alternated; and a first voltage amplitude and a second voltage amplitude of the anode voltage are different in the plurality of sub-pixel units with different colors.

In some examples, the plurality of sub-pixel units include: a red sub-pixel unit, a green sub-pixel unit and a blue sub-pixel unit; in the red sub-pixel unit, the first voltage amplitude of the anode voltage is 2.9 to 3.1 times of the second voltage amplitude; in the green sub-pixel unit, the first voltage amplitude of the anode voltage is 0.9 to 1.1 times of the second voltage amplitude; and in the blue sub-pixel unit, the first voltage amplitude of the anode voltage is 1.2 to 1.4 times of the second voltage amplitude.

In some examples, the anode voltage is a pulse signal with a second voltage and a first voltage which are alternated; and in the plurality of sub-pixel units with different colors, the first voltage and the second voltage of the anode voltage have the same duration and amplitude, and some light emitting devices are turned off.

In some examples, the plurality of sub-pixel units include: a red sub-pixel unit, a green sub-pixel unit and a blue sub-pixel unit; and the light emitting devices in some red sub-pixel units and some green sub-pixel units are turned off, or only the light emitting devices in some green sub-pixel units are turned off.

In some examples, the anode voltage is from a power voltage terminal and an initialization signal terminal.

In some examples, each light emitting device includes: an anode and a cathode opposite to each other; a hole transport layer, an electron blocking layer, a light emitting layer, a hole blocking layer and an electron transport layer between the anode and the cathode and along a direction from the anode to the cathode; each light emitting device further includes: an exciton blocking layer; and the exciton blocking layer is between the electron blocking layer and the light emitting layer.

In some examples, a material of the exciton blocking layer and a material of the electron blocking layer are mixed in the same layer.

In some examples, the electron blocking layer includes: a first electron blocking layer and a second electron blocking layer; and the second electron blocking layer is used as the exciton blocking layer.

In some examples, a material of the first electron blocking layer and a material of the second electron blocking layer are mixed in the same layer, and the first electron blocking layer and the second electron blocking layer are used as the exciton blocking layer.

In some examples, each light emitting device includes: an anode and a cathode opposite to each other; a hole transport layer, an electron blocking layer, a light emitting layer, a hole blocking layer and an electron transport layer between the anode and the cathode and along a direction from the anode to the cathode; each light emitting device further includes: an exciton blocking layer; and the exciton blocking layer is between the hole blocking layer and the light emitting layer.

In some examples, a material of the exciton blocking layer and a material of the hole blocking layer are mixed in the same layer.

In some examples, the hole blocking layer includes: a first hole blocking layer and a second hole blocking layer; and the second hole blocking layer is used as the exciton blocking layer.

In some examples, a material of the first hole blocking layer and a material of the second hole blocking layer are mixed in the same layer, and the first hole blocking layer and the second hole blocking layer are used as the exciton blocking layer.

In some examples, the light emitting layer includes: a first light emitting layer and a second light emitting layer; and one of the first emitting layer and the second light emitting layer is used as the exciton blocking layer.

In some examples, a material of the first light emitting layer and a material of the second light emitting layer are mixed in the same layer, and the first emitting layer and the second light emitting layer are used as the exciton blocking layer.

In some examples, the light emitting device includes: a red light emitting device, a green light emitting device, and a blue light emitting device; in the red light emitting device, a ratio of an electron mobility to a hole mobility of a material of the exciton blocking layer is 600:1; in the green light emitting device, a ratio of an electron mobility to a hole mobility of a material of the exciton blocking layer is 200:1; and in the blue light emitting device, a ratio of an electron mobility to a hole mobility of a material of the exciton blocking layer is 1:1000.

In some examples, in the red light emitting device, the exciton blocking layer has a highest occupied molecular orbital level in a range of 5.6 eV to 5.7 eV and a lowest unoccupied molecular orbital level in a range of 2.3 eV to 2.2 eV; in the green light emitting device, the exciton blocking layer has a highest occupied molecular orbital level in a range of 5.5 eV to 5.6 eV and a lowest unoccupied molecular orbital level in a range of 2.5 eV to 2.4 eV; in the blue light emitting device, the exciton blocking layer has a highest occupied molecular orbital level in a range of 5.4 eV to 5.5 eV and a lowest unoccupied molecular orbital level in a range of 2.4 eV to 2.3 eV.

In some examples, each sub-pixel unit further includes: a pixel driving circuit and a buffer capacitor; and one terminal of the buffer capacitor is connected to the pixel driving circuit, and the other terminal of the buffer capacitor is connected to the anode of the light emitting device.

In some examples, the light emitting device includes: a red light emitting device, a green light emitting device, and a blue light emitting device; the buffer capacitor includes: a first buffer capacitor connected to the red light emitting device, a second buffer capacitor connected to the green light emitting device, and a third buffer capacitor connected to the blue light emitting device; a capacitance value of the third buffer capacitor is greater than that of the first buffer capacitor; and the capacitance value of the first buffer capacitor is greater than that of the second buffer capacitor.

In some examples, the display panel further includes: a plurality of detection modules; and the detection module is configured to detect at least one of a brightness, a gray scale or a temperature of a region where a corresponding sub-pixel unit is located.

In a second aspect, embodiments of the present disclosure provide a display apparatus, including the above display panel.

DETAIL DESCRIPTION OF EMBODIMENTS

Figure 1:
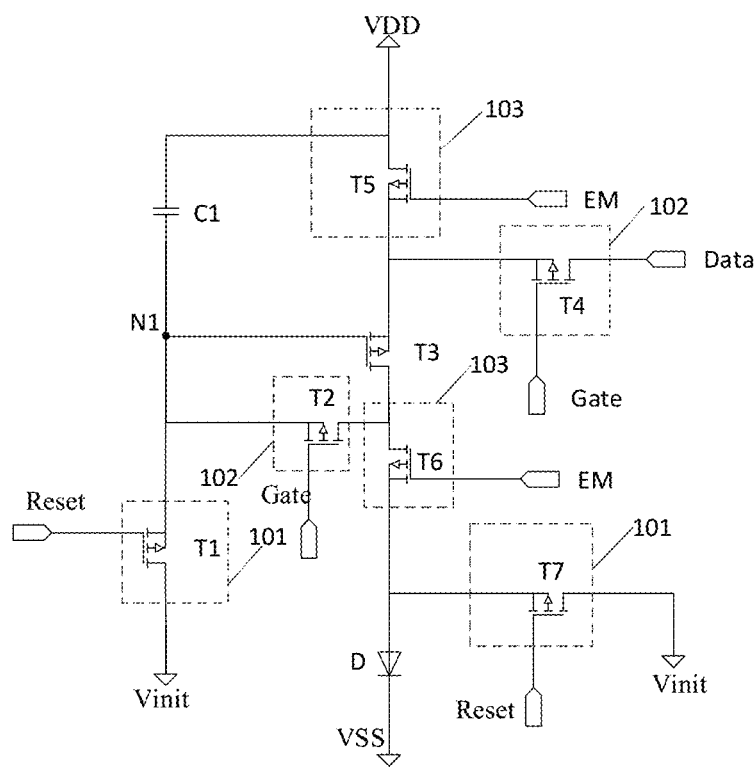
FIG. 1 is a schematic diagram of a structure of an exemplary pixel driving circuit.

In order to enable one of ordinary skill in the art to better understand the technical solutions of the present disclosure, the present disclosure will be described in further detail with reference to the accompanying drawings and the detailed description.

Unless defined otherwise, technical or scientific terms used herein shall have the ordinary meaning as understood by one of ordinary skill in the art to which the present disclosure belongs. The terms "first", "second", and the like used in the present disclosure are not intended to indicate any order, quantity, or importance, but rather are used for distinguishing one element from another. Further, the term "a", "an", "the", or the like used herein does not denote a limitation of quantity, but rather denotes the presence of at least one element. The term of "comprising", "including", or the like, means that the element or item preceding the term contains the element or item listed after the term and its equivalent, but does not exclude other elements or items. The term "connected", "coupled", or the like is not limited to physical or mechanical connections, but may include electrical connections, whether direct or indirect connections. The terms "upper", "lower", "left", "right", and the like are used only for indicating relative positional relationships, and when the absolute position of an object being described is changed, the relative positional relationships may also be changed accordingly.

Transistors used in the embodiments of the present disclosure may be thin film transistors or field effect transistors or other devices having the same characteristics. In the embodiments of the present disclosure, a drain electrode and a source electrode of each transistor may be interchangeable with each other, and therefore, the drain electrode and the source electrode of each transistor are indistinguishable in the embodiments of the present disclosure. Herein, only in order to distinguish two electrodes, except a control electrode (i.e., a gate electrode), of the transistor, one of the two electrodes is referred to as a drain electrode, and the other electrode is referred to as a source electrode. A thin film transistor used in the embodiments of the present disclosure may be an N-type transistor or a P-type transistor. In the embodiments of the present disclosure, when an N-type thin film transistor is used, a first electrode thereof may be a source electrode, and a second electrode thereof may be a drain electrode. In the following embodiments, as an example, the thin film transistor is an N-type transistor for description.

In the embodiments of the present disclosure, an operating level signal refers to a signal input to a control electrode of a transistor to control the transistor to be turned on; and a non-operating level signal refers to a signal input to a control electrode of a transistor to control the transistor to be turned off. For the N-type transistor, a high level signal is the operating level signal, and a low level signal is the non-operating level signal; for the P-type transistor, a low level signal is the operating level signal, and a high level signal is the non-operating level signal.

FIG. 1 is a schematic diagram of a structure of an exemplary pixel driving circuit. As shown in FIG. 1, the pixel driving circuit includes: an initialization sub-circuit 101, a driving transistor T3, a storage capacitor C1, a data writing sub-circuit 102, and a light emitting control sub-circuit 103.

The initialization sub-circuit 101 includes: a first transistor T1, including a gate electrode connected to a reset signal terminal Reset, a source electrode connected to an initialization signal terminal Vint, and a drain electrode connected to a first node N1; the first node N1 is a connection point of the initialization sub-circuit 101, the gate electrode of the driving transistor T3, the storage capacitor C1, and the data writing sub-circuit 102. The initialization sub-circuit 101 further includes: a seventh transistor T7, including a gate electrode connected to the reset signal terminal Reset, a source electrode connected to an initialization signal terminal Vint, and a drain electrode connected to an anode of a light emitting device D.

Optionally, the source electrodes of the first transistor T1 and the seventh transistor T7 may be connected to different initialization signal terminals Vint.

The data writing sub-circuit 102 includes: a fourth transistor T4, including a gate electrode connected to a scan signal terminal Gate, a source electrode connected to a data signal terminal Data, and a drain electrode connected to a source electrode of the driving transistor T3. The data writing sub-circuit 102 further includes: a second transistor T2, including a gate electrode connected to the scan signal terminal Gate, a source electrode connected to a drain electrode of the driving transistor T3, and a drain electrode connected to the first node N1.

The light emitting control sub-circuit 103 includes: a fifth transistor T5 and/or a sixth transistor T6; the fifth transistor T5 includes a gate electrode connected to the light emitting control signal terminal EM, a source electrode connected to a first power voltage terminal VDD, and a drain electrode connected to the source electrode of the driving transistor T3; the sixth transistor T6 includes a gate electrode connected to the light emitting control signal terminal EM, a source electrode connected to the drain electrode of the driving transistor T3, and a drain electrode connected to the anode of the light emitting device D.

One terminal of the storage capacitor C1 is connected to the first node N1, and the other terminal is connected to the first power voltage terminal VDD. The light emitting device D has the anode connected to the drain electrode of the sixth transistor T6 and the drain electrode of the seventh transistor T7, and a second electrode (cathode) connected to a second power voltage terminal VSS. The first power voltage terminal VDD is a high level voltage terminal, and the second power voltage terminal VSS is a low level voltage terminal.

Figure 2:
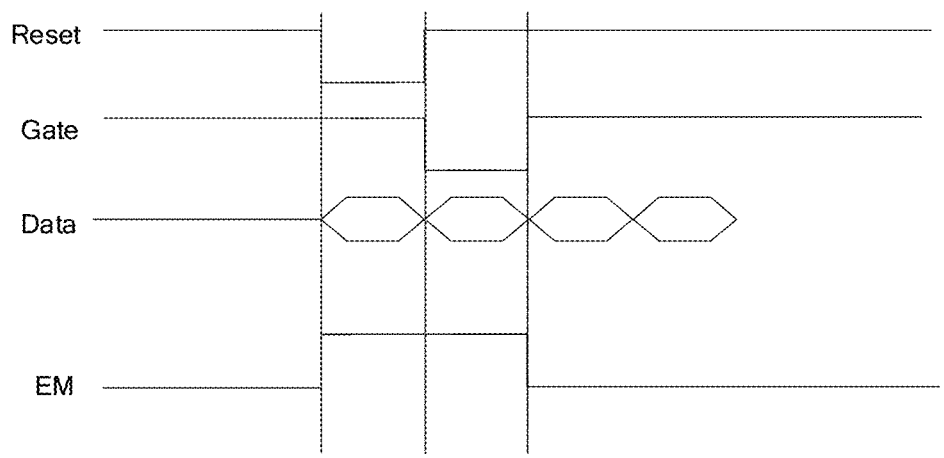
FIG. 2 is a timing diagram of the pixel driving circuit shown in FIG. 1.

FIG. 2 is a timing diagram of the pixel driving circuit shown in FIG. 1. The operation of the pixel driving circuit shown in FIG. 1 will be described below in further detail with reference to the timing diagram shown in FIG. 2.

In a first stage, the reset signal terminal Reset is provided with a low level signal, the first transistor T1 and the seventh transistor T7 are turned on, a first initialization signal is input to the first node N1 through the first transistor T1, and a second initialization signal is input to the anode of the light emitting device D through the seventh transistor T7, so as to initialize a voltage at the first node N1 and a voltage at the anode of the light emitting device D, thereby preventing a voltage input in a previous frame of a display screen from affecting a current display screen.

In a second stage, the scan signal terminal Gate is provided with a low level signal, the second transistor T2 and the fourth transistor T4 are turned on, the gate electrode and the drain electrode of the driving transistor T3 are short connected by the second transistor T2, a threshold voltage of the driving transistor T3 may be read, and the threshold voltage and a data signal are input to the first node N1, so that input of the data signal and compensation of the threshold voltage are achieved. The storage capacitor C1 may store the voltage at the first node N1.

In a third stage, the light emitting control signal terminal EM is provided with a low level signal, the fifth transistor T5 and the sixth transistor T6 are turned on, the first power voltage terminal VDD and the second power voltage terminal VSS form a current loop through the light emitting device D, which may provide a driving current for the light emitting device D, so that the light emitting device D emits light, and the degree of turning on the driving transistor T3 may be adjusted by controlling a gray scale voltage of a data signal, so as to adjust the brightness of the light emitting device D.

Figure 3:
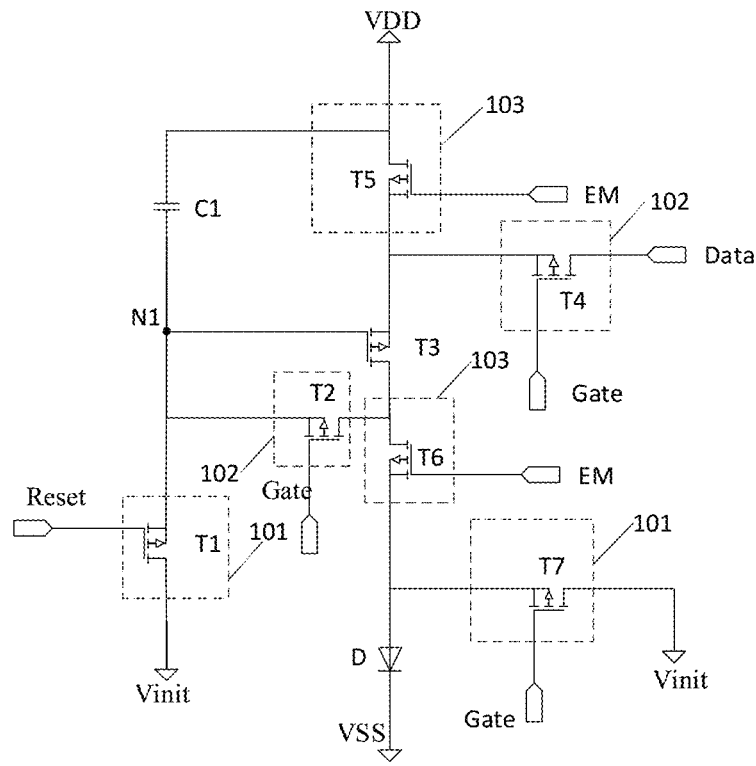
FIG. 3 is a schematic diagram of a structure of another exemplary pixel driving circuit.
Figure 4:
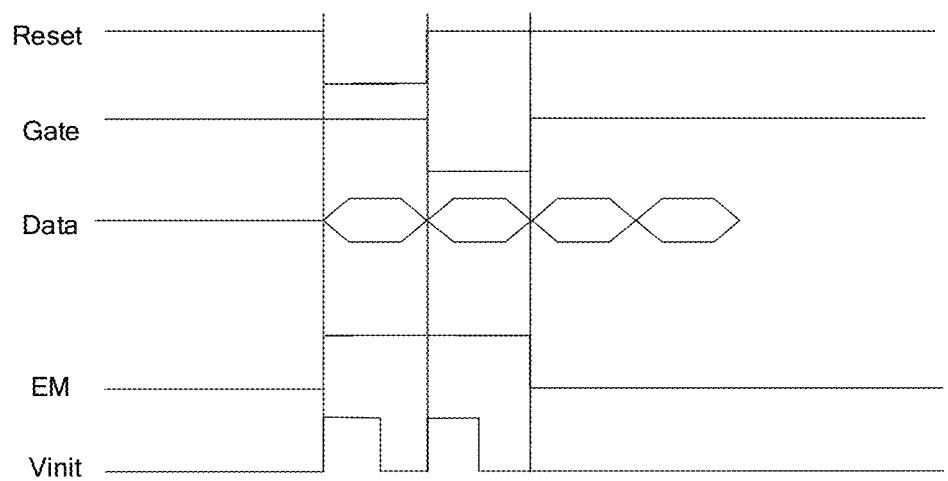
FIG. 4 is a timing diagram of the pixel driving circuit shown in FIG. 3.

FIG. 3 is a schematic diagram of a structure of another exemplary pixel driving circuit. The pixel driving circuit shown in FIG. 3 is different from the pixel driving circuit shown in FIG. 1 in that in the pixel driving circuit shown in FIG. 3, the gate electrode of the first transistor T7 is connected to the scan signal terminal Gate, the source electrode of the first transistor T7 is connected to the initialization signal terminal Vint, and the drain electrode of the first transistor T7 is connected to the anode of the light emitting device D. FIG. 4 is a timing diagram of the pixel driving circuit shown in FIG. 3. In the timing diagram shown in FIG. 4, the initialization signal provided by the initialization signal terminal Vinit is not a constant low voltage signal, but is a pulse signal with a first voltage and a second voltage which are alternated. Specifically, the first voltage may be a low voltage, and the second voltage may be a high voltage. For example, the low voltage may be a negative voltage, and the high voltage may be a positive voltage. The low voltage and the high voltage have a same duration and a same amplitude. The object is not only to initialize an anode voltage (a voltage at the anode) of the light emitting device D, but also to compensate the anode voltage of the light emitting device D, to improve the image quality of the display screen.

With the increasing use scenes of display products, different environments and different temperatures have increasingly large influence on display pictures, and users have also increasingly strict requirements on the display pictures (particularly low-gray-scale display pictures). In the OLED light emitting device, electrons and holes are injected into a light emitting layer from a cathode and an anode, respectively, and are recombined in the light emitting layer to emit light. The temperature has a large influence on the OLED light emitting device. In a high-temperature reliability test, the light emitting layer in the OLED device is irreversibly changed easily. When the pixel driving circuit is driven by using the timing as shown in FIG. 2, the compensation effect of the initialization signal on the anode voltage is not enough to meet a display requirement, which easily causes a color shift and affects the display effect.

In order to solve at least one of the above technical problems, embodiments of the present disclosure provide a display panel and a display apparatus, and the display panel and the display apparatus provided by embodiments of the present disclosure will be described in further detail below with reference to the accompanying drawings and the detailed description.

Figure 5:
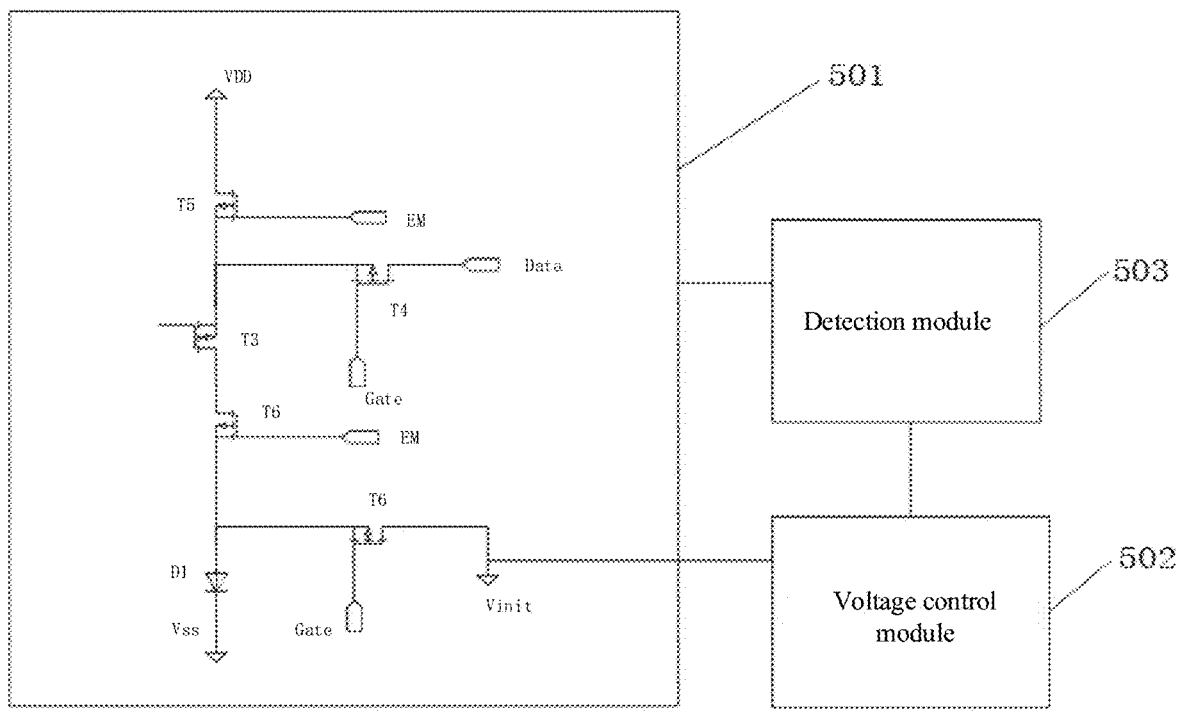
FIG. 5 is a schematic diagram of a structure of a display panel according to embodiments of the present disclosure.

FIG. 5 is a schematic diagram of a structure of a display panel according to embodiments of the present disclosure. As shown in FIG. 5, the display panel includes: a plurality of sub-pixel units 501, a voltage control module 502; each sub-pixel unit 501 includes: a light emitting device D; the voltage control module 502 is connected to an anode of the corresponding light emitting device D, and is configured to control an anode voltage of the corresponding light emitting device D, so that a ratio of (the number of) electrons to (the number of) holes of each light emitting device D is unchanged at different gray scales. For example: the ratio of electrons to holes of each light emitting device D is constant at each of high, medium, and low gray scales, such as electron:hole=1:1. For example: 256 gray scale values are included in the whole gray scale range for description as an example, specifically, the gray scale values may be 0 to 255 gray scale values, which may be divided into three gray scale intervals, wherein the first gray scale interval is a low gray scale interval (e.g., in a range of 0 to 75), the second gray scale interval may be a medium gray scale interval (e.g., in a range of 76 to 150), and the third gray scale interval may be a high gray scale interval (e.g., in a range of 151 to 255). Alternatively, for example: 256 gray scale values are included in the whole gray scale range for description, specifically, the gray scale values may be 0 to 255 gray scale values, which may be divided into two gray scale intervals, wherein the first gray scale interval is a low gray scale interval (e.g., in a range of 0 to 128), the second gray scale interval may be a high gray scale interval (e.g., in a range of 129 to 255). Of course, the present disclosure is not limited thereto, other division methods are possible.

Each sub-pixel unit 501 may include: the light emitting device D, and may further include a pixel driving circuit for driving the light emitting device D to emit light. The pixel driving circuit may be the same as the pixel driving circuit shown in FIG. 3, and may provide the anode voltage to the anode of the light emitting device D, so that a driving current is formed between the anode and the cathode of the light emitting device D, and the light emitting device D emits light.

As shown in FIG. 5, the display panel may further include: a plurality of detection modules 503. Specifically, each detection module 503 may be a gray level detection module configured to detect a gray level of a region where the corresponding sub-pixel unit 501 is located, or each detection module 503 may be a brightness detection module configured to detect a brightness of the region where the corresponding sub-pixel unit 501 is located, or each detection module may be a temperature detection module configured to detect a temperature of the region where the corresponding sub-pixel unit 501 is located. Optionally, each detection module is configured to detect at least one of the brightness, the gray scale or the temperature of the region where the corresponding sub-pixel unit is located. For example: each detection module 503 may acquire an image of each sub-pixel or a display substrate through an image collector, such as a camera, to acquire a corresponding gray scale. Alternatively, each detection module 503 may acquire a corresponding brightness of each sub-pixel or the display substrate through the image collector, such as the camera. Alternatively, each detection module 503 may further include a temperature sensor, the temperature of each sub-pixel or the display substrate may be acquired by the temperature sensor, and a correspondence between the temperature and the brightness may be acquired.

The voltage control module 502 may control the anode voltage of the corresponding light emitting device D according to detection information of the corresponding sub-pixel unit 501 provided by the detection module 503. For example: the voltage control module 502 may control the anode voltage of the corresponding light emitting device D according to the detection information of the corresponding sub-pixel unit 501 provided by the detection module, such as the brightness or the gray scale, or a correspondence between the gray scale and the brightness, or the correspondence between the temperature and the brightness.

Optionally, at least one of the voltage control module 502 and the detection module 503 may be disposed on the display panel or integrated in a driving chip of the display panel. For example: the driving chip may be disposed on a printed circuit board or a flexible circuit board.

Figure 6:
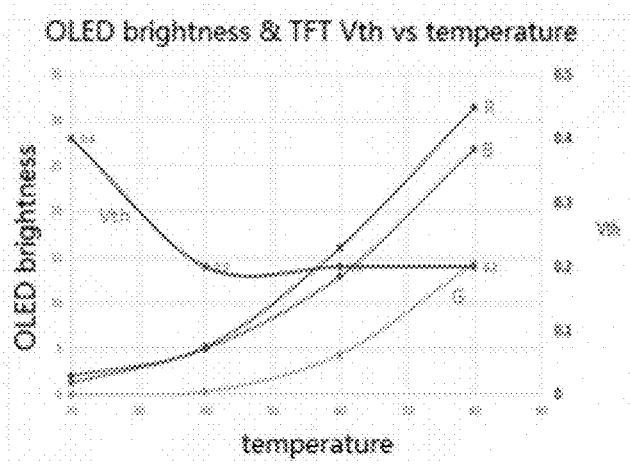
FIG. 6 is a graph illustrating brightness and a threshold voltage varying as a function of a temperature.
Figure 7:
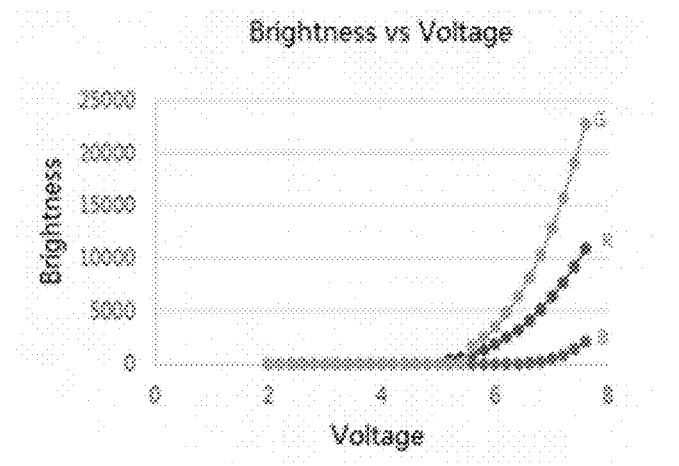
FIG. 7 is a graph illustrating brightness varying as a function of an anode voltage.

FIG. 6 is a graph illustrating brightness and a threshold voltage varying as a function of a temperature. It can be seen that, as the temperature increases, the threshold voltage of the driving transistor gradually decreases, the brightness of the light emitting device D gradually increases, and the brightness of each light emitting device D in the high-temperature reliability test is significantly different from that in the normal temperature environment. FIG. 7 is a graph illustrating brightness varying as a function of an anode voltage. It can be seen that the brightness of the light emitting device D is mainly determined by the anode voltage.

In the display panel provided by the embodiments of the present disclosure, the anode voltage of the light emitting device D may be directly adjusted by the voltage control module 502, to adjust the number of electrons and the number of holes in the light emitting device D, so that the number of electrons and the number of holes are equal to each other at the same time, and the ratio of the number of electrons to the number of holes under different voltages is kept unchanged. In this way, it can be ensured that the brightness of the light emitting device D is not affected by the temperature, the color shift problem, which is caused by a change of a threshold voltage or a recombination center due to the high-temperature reliability test for the display panel, can be avoided, and the display effect of the display panel can be improved.

In some embodiments, the anode voltage is a pulse signal with a first voltage and a second voltage which are alternated; as for the sub-pixel units 501 with different colors, ratios of first voltage durations to second voltage durations of the anode voltages are different.

It should be noted that the first voltage may be a low voltage, and the second voltage may be a high voltage, for example, the low voltage may be a negative voltage, and the high voltage may be a positive voltage, where the duration of the low voltage is different from that of the high voltage. In the driving signal, a power voltage signal at a high level voltage terminal is generally a constant high voltage, which does not change with the external environment, and therefore, the anode voltage of the light emitting device D is mainly determined by the initialization signal at the initialization signal terminal Vinit. In the following description, the anode voltage may mainly refer to the initialization signal at the initialization signal terminal Vinit, and the adjustment for timing of the anode voltage is only the adjustment for timing of the initialization signal.

In a specific example, the duration of the low level voltage is longer, and the duration of the high level voltage is shorter. The number of electrons and the number of holes in the light emitting device D may be adjusted by controlling the duration of the low voltage and the duration of the high voltage of the anode voltage, so that the number of electrons and the number of holes are equal to each other in the same time, and the ratio of the number of electrons to the number of holes under different voltages is kept unchanged. In this way, it can be ensured that the brightness of the light emitting device D is not affected by the temperature, the color shift problem, which is caused by a change of a threshold voltage or a recombination center due to the high-temperature reliability test for the display panel, can be avoided, and the display effect of the display panel can be improved.

Figure 8A:
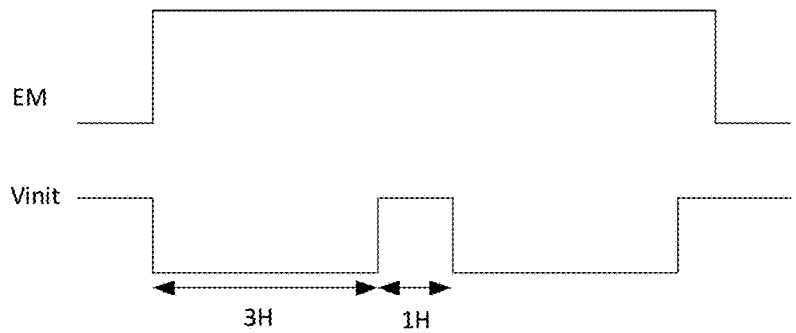
FIGS. 8a to 8c are timing diagrams of driving signals of light emitting devices of different colors according to embodiments of the present disclosure.
Figure 8B:
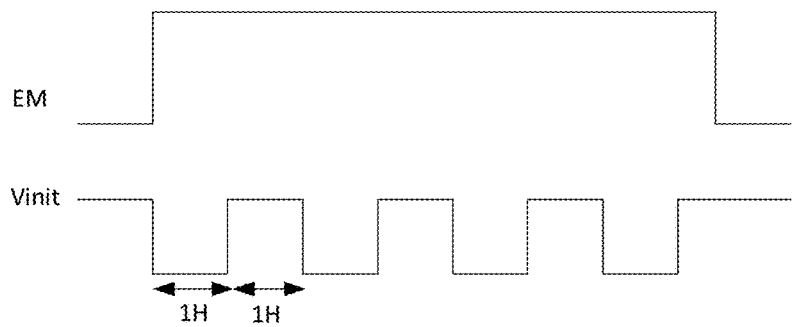
Figure 8C:
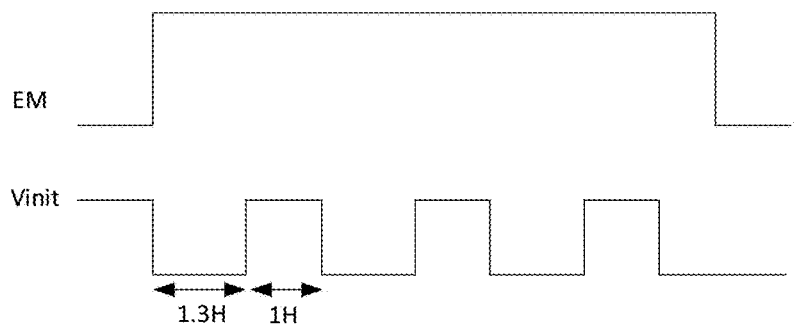

In some embodiments, as shown in FIG. 3, the anode voltage is provided by a power voltage terminal and the initialization signal terminal Vinit. The power voltage terminal may be the first power voltage terminal VDD, i.e., the high level voltage terminal, which is input to the anode of the light emitting device D together with the initialization signal at the initialization signal terminal Vinit, to provide the anode voltage. FIGS. 8a to 8c are timing diagrams of driving signals of light emitting devices of different colors according to embodiments of the present disclosure. Only the timing of the initialization signal in the driving signals is different from that in FIG. 4, and the timings of other driving signals are the same as those in FIG. 4. FIGS. 8a to 8c only show the timings of the light emitting control signal at the light emitting control signal terminal EM and the initialization signal at the initialization signal terminal Vinit.

Optionally, the timing or a voltage amplitude of the initialization signal at the initialization signal terminal Vinit may be adjusted by the voltage control module, so that the ratio of the number of holes to the number of electrons of each light emitting device D (e.g., R/G/B, that is, a red light emitting device or a green light emitting device or a blue light emitting device) of each sub-pixel unit 501 is kept unchanged in different gray scales of the display panel.

As shown in FIG. 8a, in the red sub-pixel unit, in which the color of the light emitting device D is red, and a low voltage duration is 2.9 to 3.1 times (preferably 3 times) a high voltage duration of the anode voltage of the red light emitting device. The number of electrons and the number of holes in the red light emitting device may be adjusted, so that the number of electrons and the number of holes are equal to each other in the same time, and the ratio of the number of electrons to the number of holes under different voltages is kept unchanged. In this way, it can be ensured that the brightness of the red light emitting device is not affected by the temperature. For example: in the low gray scale or the high gray scale, specifically, the low voltage duration may be 3H, and the high voltage duration is 1H, where 1H is a time for refreshing the display picture once, which is related to a refresh rate of the display panel. For example, the refresh rate is 60 seconds, and 1H is 1/60 seconds.

As shown in FIG. 8b, in the green sub-pixel unit, in which the color of the light emitting device D is green, and a low voltage duration is 0.9 to 1.1 times a high voltage duration of the anode voltage of the green light emitting device (preferably 1 times, that is, the low voltage duration is the same as the high voltage duration of the anode voltage of the green light emitting device). The number of electrons and the number of holes in the green light emitting device are not substantially affected by the temperature, and thus the anode voltage may be kept unchanged. For example: in the low gray scale or the high gray scale, specifically, the low voltage duration may be 1H, and the high voltage duration may be 1H.

As shown in FIG. 8c, in the blue sub-pixel unit, in which the color of the light emitting device D is blue, and a low voltage duration is 1.2 to 1.4 times (preferably 1.3 times) a high voltage duration of the anode voltage of the blue light emitting device. The number of electrons and the number of holes in the blue light emitting device may be adjusted, so that the number of electrons and the number of holes are equal to each other in the same time, and the ratio of the number of electrons to the number of holes under different voltages is kept unchanged. In this way, it can be ensured that the brightness of the blue light emitting device is not affected by the temperature. For example: in the low gray scale or the high gray scale, specifically, the low voltage duration may be 1.3H, and the high voltage duration is 1H.

In practical application, the low voltage duration is 3 times the high voltage duration of the initialization signal in the red sub-pixel, the low voltage duration is the same as the high voltage duration of the initialization signal in the green sub-pixel, and the low voltage duration is 1.3 times the high voltage duration of the initialization signal in the blue sub-pixel, so that the number of electrons and the number of holes are equal to each other in the same time, and the ratio of the number of electrons to the number of holes under different voltages is kept unchanged. In this way, it can be ensured that the brightness of the red light emitting device, the green light emitting device and the blue light emitting device is not affected by the temperature, the color shift problem, which is caused by a change of a threshold voltage or a recombination center due to the high-temperature reliability test for the display panel, can be avoided, and the display effect of the display panel can be improved.

In some embodiments, the anode voltage is the pulse signal with the second voltage and the first voltage which are alternated; in the sub-pixel units with different colors, a first voltage amplitude and a second voltage amplitude of the anode voltage are different.

It should be noted that the first voltage may be a low voltage, and the second voltage may be a high voltage, where the amplitude of the low voltage is different from amplitude of the high voltage. In the driving signal, the power voltage signal at the high level voltage terminal is generally the constant high voltage, which does not change with the external environment, and therefore, the anode voltage of the light emitting device D is mainly determined by the initialization signal at the initialization signal terminal Vinit. In the following description, the anode voltage may mainly refer to the initialization signal at the initialization signal terminal Vinit, and the adjustment for the timing of the anode voltage is only the adjustment for the timing of the initialization signal.

In a specific example, the amplitude of the low level voltage is larger, the amplitude of the high level voltage is smaller. The amplitude here is an absolute value of a voltage value of the high voltage or the low voltage. The number of electrons and the number of holes in the light emitting device D may be adjusted by controlling the amplitude of the low voltage and the amplitude of the high voltage of the anode voltage, so that the number of electrons and the number of holes are equal to each other in the same time, and the ratio of the number of electrons to the number of holes under different voltages is kept unchanged. In this way, it can be ensured that the brightness of the light emitting device D is not affected by the temperature, the color shift problem, which is caused by a change of a threshold voltage or a recombination center due to the high-temperature reliability test for the display panel, can be avoided, and the display effect of the display panel can be improved.

Figure 9A:
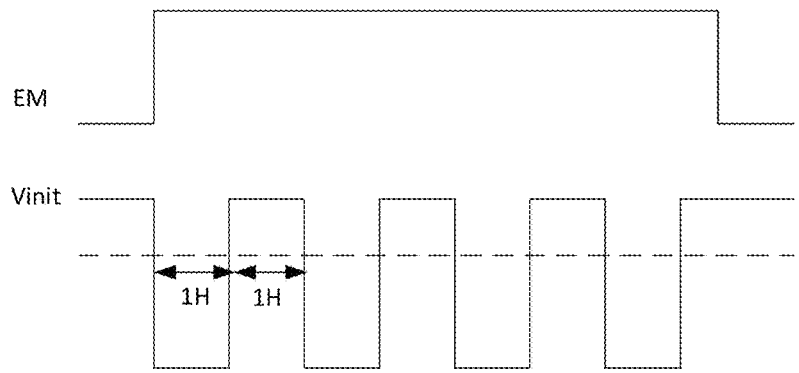
FIGS. 9a to 9c are timing diagrams of driving signals of light emitting devices of different colors according to embodiments of the present disclosure.
Figure 9B:
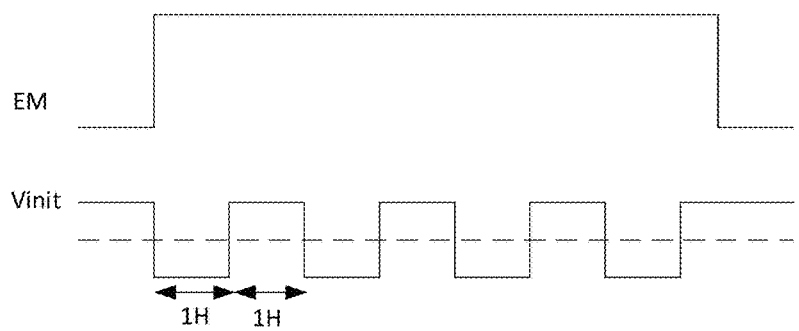
Figure 9C:
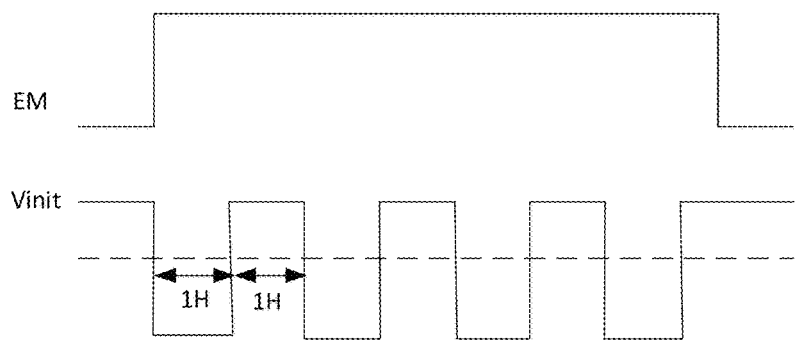

In some embodiments, FIGS. 9a to 9c are timing diagrams of driving signals of light emitting devices of different colors according to embodiments of the present disclosure. Only the timing of the initialization signal in the driving signals is different from that in FIG. 4, and the timings of other driving signals are the same as those in FIG. 4. FIGS. 9a to 9c only show the timings of the light emitting control signal at the light emitting control signal terminal EM and the initialization signal at the initialization signal terminal Vinit.

As shown in FIG. 9a, in the red sub-pixel unit, in which the color of the light emitting device D is red, and a low voltage amplitude is 2.9 to 3.1 times (preferably 3 times) a high voltage amplitude of the anode voltage of the red light emitting device. The number of electrons and the number of holes in the red light emitting device may be adjusted, so that the number of electrons and the number of holes are equal to each other in the same time, and the ratio of the number of electrons to the number of holes under different voltages is kept unchanged. In this way, it can be ensured that the brightness of the red light emitting device is not affected by the temperature. For example: in the low gray scale or the high gray scale, specifically, the low voltage amplitude may be 9V, i.e., −9V, and the high voltage amplitude may be 3V, i.e., +3V.

As shown in FIG. 9b, in the green sub-pixel unit, in which the color of the light emitting device D is green, and a low voltage amplitude is 0.9 to 1.1 times a high voltage amplitude of the anode voltage of the green light emitting device (preferably 1 times, that is, the low voltage amplitude is the same as the high voltage amplitude of the anode voltage of the green light emitting device). The number of electrons and the number of holes in the green light emitting device are not substantially affected by the temperature, and thus the anode voltage may be kept unchanged. For example: in the low gray scale or the high gray scale, specifically, the low voltage amplitude may be 3V, i.e., −3V, and the high voltage amplitude may be 3V, i.e., +3V.

As shown in FIG. 9c, in the blue sub-pixel unit, in which the color of the light emitting device D is blue, and a low voltage amplitude is 1.2 to 1.4 times (preferably 1.3 times) a high voltage amplitude of the anode voltage of the blue light emitting device. The number of electrons and the number of holes in the blue light emitting device may be adjusted, so that the number of electrons and the number of holes are equal to each other in the same time, and the ratio of the number of electrons to the number of holes under different voltages is kept unchanged. In this way, it can be ensured that the brightness of the blue light emitting device is not affected by the temperature. For example: in the low gray scale or the high gray scale, specifically, the low voltage amplitude may be 3.9V, i.e., −3.9V, and the high voltage amplitude may be 3V, i.e., +3V.

In practical application, the low voltage amplitude is 3 times the high voltage amplitude of the initialization signal in the red sub-pixel, the low voltage amplitude is the same as the high voltage amplitude of the initialization signal in the green sub-pixel, and the low voltage amplitude is 1.3 times the high voltage amplitude of the initialization signal in the blue sub-pixel, so that the number of electrons and the number of holes are equal to each other in the same time, and the ratio of the number of electrons to the number of holes under different voltages is kept unchanged. In this way, it can be ensured that the brightness of the red light emitting device, the green light emitting device and the blue light emitting device is not affected by the temperature, the color shift problem, which is caused by a change of a threshold voltage or a recombination center due to the high-temperature reliability test for the display panel, can be avoided, and the display effect of the display panel can be improved.

In some embodiments, the anode voltage is a pulse signal with a first voltage and a second voltage which are alternated; in the sub-pixel units with different colors, the first voltage and the second voltage of the anode voltage have the same duration and amplitude, and some light emitting devices D are turned off.

In the high-temperature reliability test, the probability of occurrence of the yellow color shift and the green color shift is higher. The yellow color shift is caused by excessive brightness of the red emitting device in the red sub-pixel unit and the green emitting device in the green sub-pixel unit. In practical application, the red light emitting devices in some red sub-pixel units and the green light emitting devices in some green sub-pixel units may be turned off, so that the brightness of the red sub-pixel units and the green sub-pixel units in a part of the region of the display panel can be reduced, the yellow color shift is avoided, and the display effect of the display panel can be improved. Specifically, a proportion of the turned off red light emitting devices and a proportion of the turned off green light emitting devices may be set according to actual needs. When the yellow color shift is serious, more red light emitting devices and more green light emitting devices may be turned off. For example, the number of the turned off red light emitting devices and the turned off green light emitting devices may be 80% of the total number of the light emitting devices in the region. When the yellow color shift is not serious, less red light emitting devices and less green light emitting devices may be turned off. For example, the number of the turned off red light emitting devices and the turned off green light emitting devices may be 20% of the total number of the light emitting devices in the region.

The green color shift is caused by excessive brightness of the green emitting device in the green sub-pixel unit. In practical application, the green light emitting devices in some green sub-pixel units may be turned off, so that the brightness of the green sub-pixel units in a part of the region of the display panel can be reduced, the green color shift is avoided, and the display effect of the display panel can be improved. Specifically, a proportion of the turned off green light emitting devices may be set according to actual needs. When the green color shift is serious, more green light emitting devices may be turned off. For example, the number of the turned off green light emitting devices may be 80% of the total number of the light emitting devices in the region. When the green color shift is not serious, less green light emitting devices may be turned off. For example, the number of the turned off green light emitting devices may be 20% of the total number of the light emitting devices in the region.

Figure 10:
FIG. 10 is a schematic diagram of a structure of a first light emitting device according to embodiments of the present disclosure.

FIG. 10 is a schematic diagram of a structure of a first light emitting device according to embodiments of the present disclosure. As shown in FIG. 10, the light emitting device D includes: an anode 5011 and a cathode 5012 opposite to each other, a hole transport layer 5013, an electron blocking layer 5014, a light emitting layer 5015, a hole blocking layer 5016, and an electron transport layer 5017 which are provided between the anode 5011 and the cathode 5012 in a direction from the anode 5011 to the cathode 5012; the light emitting device D further includes: an exciton blocking layer 5018; the exciton blocking layer 5018 is located between the electron blocking layer 5014 and the light emitting layer 5015.

The exciton blocking layer 5018 is provided between the electron blocking layer 5014 and the light emitting layer 5015 in the light emitting device D, and an energy level difference between the exciton blocking layer 5018 and the electron blocking layer 5014 is larger than 0.3 eV, so that an interface capacitor may be formed between the exciton blocking layer 5018 and the electron blocking layer 5014, the number of holes/carriers may be controlled, and then the recombination center is fixed. In this way, it can be ensured that the brightness of the light emitting device D is not affected by the temperature, the color shift problem, which is caused by a change of the recombination center due to the high-temperature reliability test for the display panel, can be avoided, and the display effect of the display panel can be improved.

Figure 11:
FIG. 11 is a schematic diagram of a structure of a second light emitting device according to embodiments of the present disclosure.

FIG. 11 is a schematic diagram of a structure of a second light emitting device according to embodiments of the present disclosure. As shown in FIG. 11, a material of the exciton blocking layer 5018 and a material of the electron blocking layer 5014 are mixed in the same layer.

The material of the exciton blocking layer 5018 and the material of the electron blocking layer 5014 may be pre-mixed, and then the mixed materials are formed in the same layer through a one-time film forming process, so that the film forming steps can be reduced, and the manufacturing cost can be saved.

Figure 12:
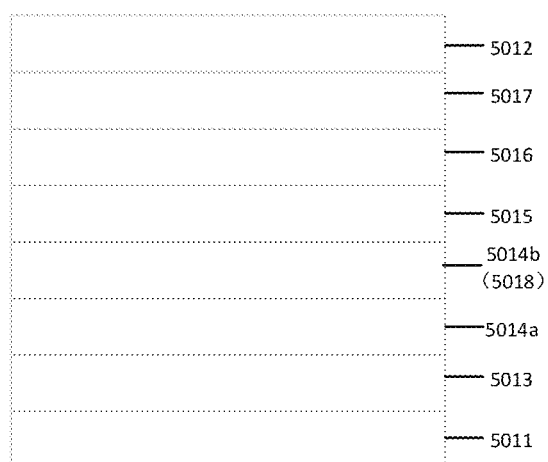
FIG. 12 is a schematic diagram of a structure of a third light emitting device according to embodiments of the present disclosure.

FIG. 12 is a schematic diagram of a structure of a third light emitting device according to embodiments of the present disclosure. As shown in FIG. 12, the electron blocking layer 5014 includes: a first electron blocking layer 5014a and a second electron blocking layer 5014b; the second electron blocking layer 5014b is further used as the exciton blocking layer 5018.

The electron blocking layer 5014 may be formed using a multi-layer structure, such as a two-layer structure of the first electron blocking layer 5014a and the second electron blocking layer 5014b. The first electron blocking layer 5014a and the second electron blocking layer 5014b may be made of different materials, so that an interface capacitor is formed between the first electron blocking layer 5014a and the second electron blocking layer 5014b, the number of holes/carriers may be controlled, and then the recombination center is fixed. In this way, it can be ensured that the brightness of the light emitting device D is not affected by the temperature, the color shift problem, which is caused by a change of the recombination center due to the high-temperature reliability test for the display panel, can be avoided, and the display effect of the display panel can be improved.

Figure 13:
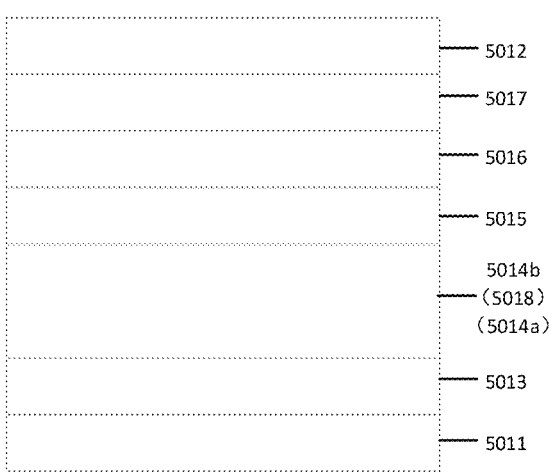
FIG. 13 is a schematic diagram of a structure of a fourth light emitting device according to embodiments of the present disclosure.

FIG. 13 is a schematic diagram of a structure of a fourth light emitting device according to embodiments of the present disclosure. As shown in FIG. 13, a material of the first electron blocking layer 5014a and a material of the second electron blocking layer 5014b are mixed in the same layer, and the first electron blocking layer 5014a and the second electron blocking layer 5014b are further used as the exciton blocking layer 5018.

The material of the first electron blocking layer 5014a and the material of the second electron blocking layer 5014b may be pre-mixed, and then the mixed materials are formed in the same layer through a one-time film forming process, so that the film forming steps can be reduced, and the process cost can be saved.

Figure 14:
FIG. 14 is a schematic diagram of a structure of a fifth light emitting device according to embodiments of the present disclosure.

FIG. 14 is a schematic diagram of a structure of a fifth light emitting device according to embodiments of the present disclosure. As shown in FIG. 14, the light emitting device D includes: an anode 5011 and a cathode 5012 opposite to each other, a hole transport layer 5013, an electron blocking layer 5014, a light emitting layer 5015, a hole blocking layer 5016, and an electron transport layer 5017 which are provided between the anode 5011 and the cathode 5012 in a direction from the anode 5011 to the cathode 5012; the light emitting device D further includes: an exciton blocking layer 5018; the exciton blocking layer 5018 is located between the hole blocking layer 5016 and the light emitting layer 5015.

The exciton blocking layer 5018 is provided between the hole blocking layer 5016 and the light emitting layer 5015 in the light emitting device D, and an energy level difference between the exciton blocking layer 5018 and the hole blocking layer 5016 is larger than 0.3 eV, so that an interface capacitor is formed between the exciton blocking layer 5018 and the hole blocking layer 5016, the number of holes/carriers may be controlled, and then the recombination center is fixed. In this way, it can be ensured that the brightness of the light emitting device D is not affected by the temperature, the color shift problem, which is caused by a change of the recombination center due to the high-temperature reliability test for the display panel, can be avoided, and the display effect of the display panel can be improved.

Figure 15:
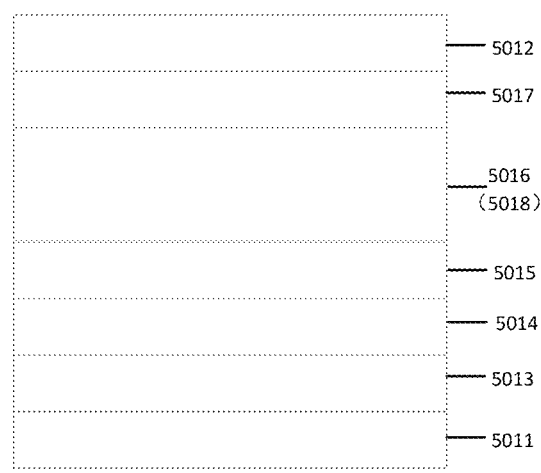
FIG. 15 is a schematic diagram of a structure of a sixth light emitting device according to embodiments of the present disclosure.

FIG. 15 is a schematic diagram of a structure of a sixth light emitting device according to embodiments of the present disclosure. As shown in FIG. 15, a material of the exciton blocking layer 5018 and a material of the hole blocking layer 5016 are mixed in the same layer.

The material of the exciton blocking layer 5018 and the material of the hole blocking layer 5016 may be pre-mixed, and then the mixed materials are formed in the same layer through a one-time film forming process, so that the film forming steps can be reduced, and the process cost can be saved.

Figure 16:
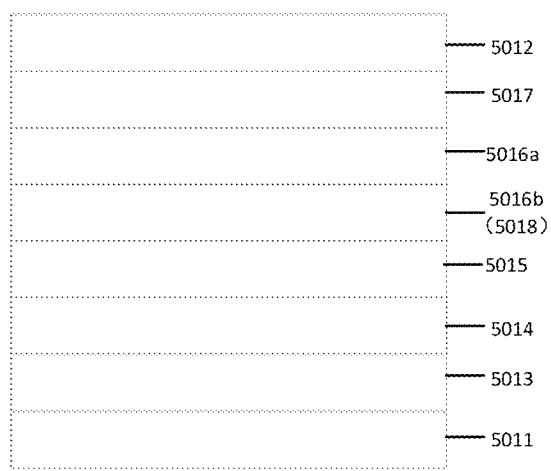
FIG. 16 is a schematic diagram of a structure of a seventh light emitting device according to embodiments of the present disclosure.

FIG. 16 is a schematic diagram of a structure of a seventh light emitting device according to embodiments of the present disclosure. As shown in FIG. 16, the hole blocking layer 5016 includes: a first hole blocking layer 5016a and a second hole blocking layer 5016b; the second hole blocking layer 5016b is further used as the exciton blocking layer 5018.

The hole blocking layer 5016 may be formed using a multi-layer structure, such as a two-layer structure of the first hole blocking layer 5016a and the second hole blocking layer 5016b. The materials of the first hole blocking layer 5016a and the second hole blocking layer 5016b may be different, so that an interface capacitor is formed between the first hole blocking layer 5016a and the second hole blocking layer 5016b, the number of holes/carriers may be controlled, and then the recombination center is fixed. In this way, it can be ensured that the brightness of the light emitting device D is not affected by the temperature, the color shift problem, which is caused by a change of the recombination center due to the high-temperature reliability test for the display panel, can be avoided, and the display effect of the display panel can be improved.

Figure 17:
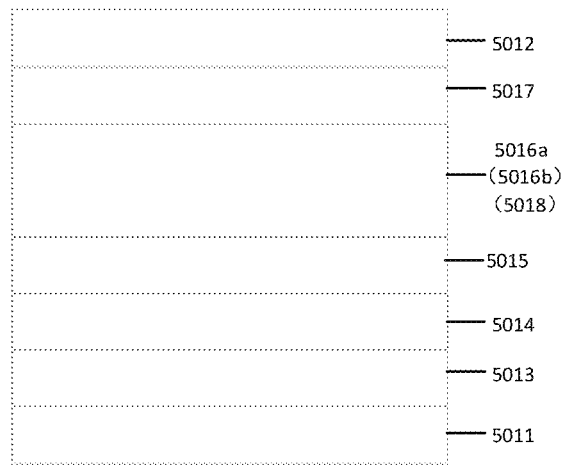
FIG. 17 is a schematic diagram of a structure of an eighth light emitting device according to embodiments of the present disclosure.

FIG. 17 is a schematic diagram of a structure of an eighth light emitting device according to embodiments of the present disclosure. As shown in FIG. 17, a material of the first hole blocking layer 5016a and a material of the second hole blocking layer 5016b are mixed in the same layer, and the first hole blocking layer 5016a and the second hole blocking layer 5016b are further used as the exciton blocking layer 5018.

The material of the first hole blocking layer 5016a and the material of the second hole blocking layer 5016b may be pre-mixed, and then the mixed materials are formed in the same layer through a one-time film forming process, so that the film forming steps can be reduced, and the process cost can be saved.

Figure 18:
FIG. 18 is a schematic diagram of a structure of a ninth light emitting device according to embodiments of the present disclosure.

FIG. 18 is a schematic diagram of a structure of a ninth light emitting device according to embodiments of the present disclosure. As shown in FIG. 18, the light emitting layer 5015 includes: a first light emitting layer 5015a and a second light emitting layer 5015b; one of the first light emitting layer 5015a and the second light emitting layer 5015b is further used as the exciton blocking layer 5018.

The light emitting layer 5015 may be formed using a multi-layer structure, such as a two-layer structure of the first light emitting layer 5015a and the second light emitting layer 5015b. The first light emitting layer 5015a and the second light emitting layer 5015b may be different, so that an interface capacitor is formed between the first light emitting layer 5015a and the second light emitting layer 5015b, the number of holes/carriers may be controlled, and then the recombination center is fixed. In this way, it can be ensured that the brightness of the light emitting device D is not affected by the temperature, the color shift problem, which is caused by a change of the recombination center due to the high-temperature reliability test for the display panel, can be avoided, and the display effect of the display panel can be improved.

Figure 19:
FIG. 19 is a schematic diagram of a structure of a tenth light emitting device according to embodiments of the present disclosure.

FIG. 19 is a schematic diagram of a structure of a tenth light emitting device according to embodiments of the present disclosure. As shown in FIG. 19, a material of the first light emitting layer 5015a and a material of the second light emitting layer 5015b are mixed in the same layer, and the first light emitting layer 5015a and the second light emitting layer 5015b are further used as the exciton blocking layer 5018.

The material of the first light emitting layer 5015a and the material of the second light emitting layer 5015b may be pre-mixed, and then the mixed materials may be formed in the same layer through a one-time film forming process, so that the film forming steps can be reduced, and the process cost can be saved.

In some embodiments, the light emitting device D includes: the red light emitting device, the green light emitting device, and the blue light emitting device; in the red light emitting device, a ratio of an electron mobility to a hole mobility of the material of the exciton blocking layer 5018 is 600:1; in the green light emitting device, the ratio of the electron mobility to the hole mobility of the material of the exciton blocking layer 5018 is 200:1; in the blue light emitting device, the ratio of the electron mobility to the hole mobility of the material of the exciton blocking layer 5018 is 1:1000.

In the red light emitting device, the exciton blocking layer 5018 may be preferably made of an electron material with the ratio of the electron mobility to the hole mobility of about 600:1, so that it can be ensured that the recombination center of the red light emitting device is fixed, and that the brightness of the red light emitting device is not affected by the temperature. In the green light emitting device, the exciton blocking layer 5018 may be preferably made of an electron material with the ratio of the electron mobility to the hole mobility of about 200:1, so that it can be ensured that the recombination center of the green light emitting device is fixed, and that the brightness of the green light emitting device is not affected by the temperature. In the blue light emitting device, the exciton blocking layer 5018 may be preferably made of a hole material with the ratio of the electron mobility to the hole mobility of about 1:1000, so that it can be ensured that the recombination center of the blue light emitting device is fixed, and that the brightness of the blue light emitting device is not affected by the temperature.

In some embodiments, the highest occupied molecular orbital level of the exciton blocking layer 5018 is in a range of 5.6 eV to 5.7 eV and the lowest unoccupied molecular orbital level of the exciton blocking layer 5018 is in a range of 2.3 eV to 2.2 eV in the red light emitting device. In this way, it can be ensured that the matching between energy levels of the exciton blocking layer 5018 and the adjacent electron blocking layer 5014 and the light emitting layer 5015 in the red light emitting device, thereby ensuring the hole transport.

The highest occupied molecular orbital level of the exciton blocking layer 5018 is in a range of 5.6 eV to 5.7 eV and the lowest unoccupied molecular orbital level of the exciton blocking layer 5018 is in a range of 2.5 eV to 2.4 eV in the green light emitting device. In this way, it can be ensured that the matching between energy levels of the exciton blocking layer 5018 and the adjacent electron blocking layer 5014 and the light emitting layer 5015 in the green light emitting device, thereby ensuring the hole transport.

The highest occupied molecular orbital level of the exciton blocking layer 5018 is in a range of 5.4 eV to 5.5 eV and the lowest unoccupied molecular orbital level of the exciton blocking layer 5018 is in a range of 2.4 eV to 2.3 eV in the blue light emitting device. In this way, it can be ensured that the matching between energy levels of the exciton blocking layer 5018 and the adjacent electron blocking layer 5014 and the light emitting layer 5015 in the blue light emitting device, thereby ensuring the hole transport.

Figure 20:
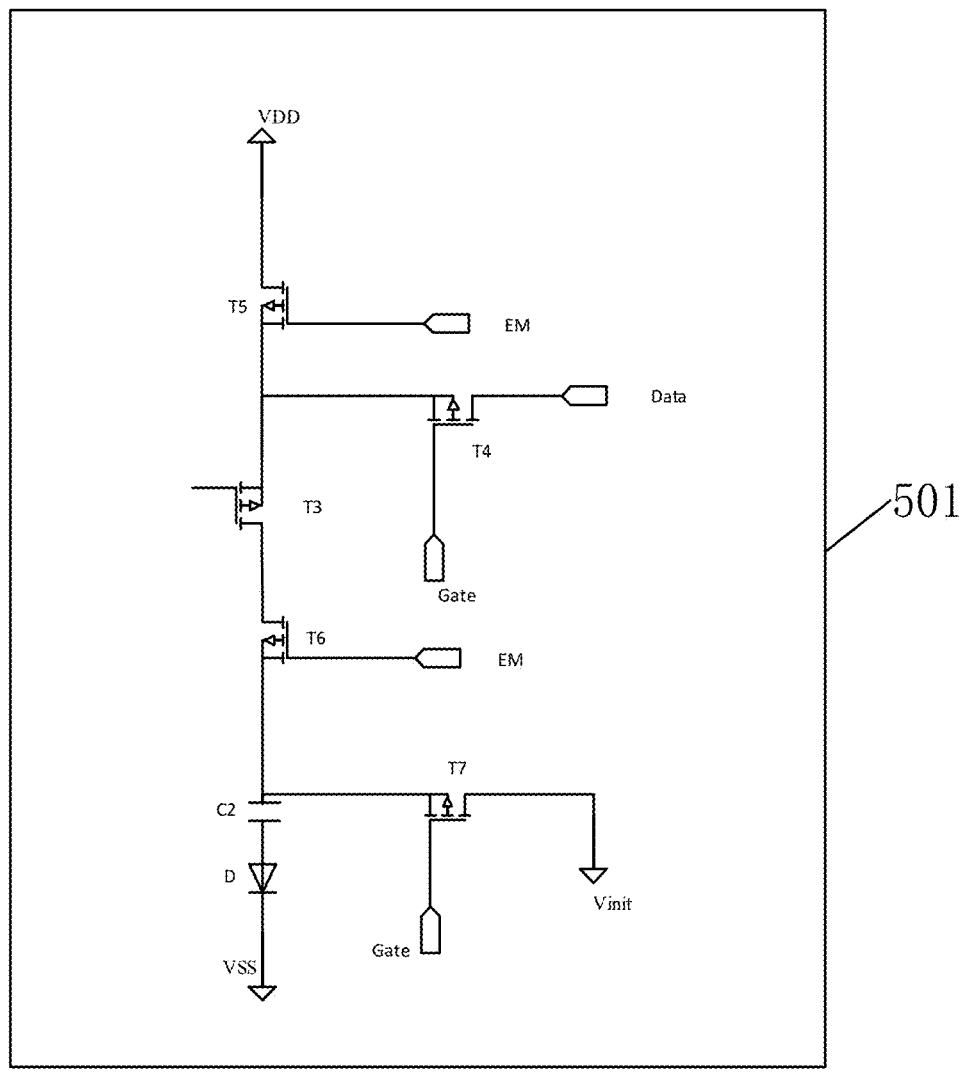
FIG. 20 is a schematic diagram of a structure of another display panel according to embodiments of the present disclosure.

FIG. 20 is a schematic diagram of a structure of another display panel according to embodiments of the present disclosure. As shown in FIG. 20, each sub-pixel unit 501 in the display panel includes: a light emitting device D, a pixel driving circuit and a buffer capacitor C2, wherein one terminal of the buffer capacitor C2 is connected to the pixel driving circuit, and the other terminal of the buffer capacitor C2 is connected to an anode of the light emitting device D. The pixel driving circuit in the pixel unit 501 shown in FIG. 20 may be the same as the pixel driving circuit shown in FIG. 3, the buffer capacitor C2 is provided in the pixel driving circuit in the pixel unit 501 shown in FIG. 20. The hole mobility is greater than the electron mobility at a low voltage, the buffer capacitor C2 may regulate the number of holes on both sides of the light emitting device D, and the buffer capacitor C2 is turned on at a high voltage, so that the number of holes passing through the light emitting device D is increased, and the influence of the potential barrier of the light emitting device D is decreased, and thus the number of electrons passing through the light emitting device D is increased, and the ratio of the number of electrons to the number of holes passing through the light emitting device D at high and low voltages is kept unchanged. In this way, it can be ensured that the brightness of the light emitting device D is not affected by the temperature, the color shift problem, which is caused by a change of a recombination center due to the high-temperature reliability test for the display panel, can be avoided, and the display effect of the display panel can be improved.

Optionally, one terminal of the buffer capacitor C2 is connected to the drain electrode of the seventh transistor, and the other terminal is connected to the anode of the light emitting device D.

Optionally, one terminal of the buffer capacitor C2 is connected to the drain electrode of the sixth transistor, and the other terminal is connected to the anode of the light emitting device D.

Figure 21:
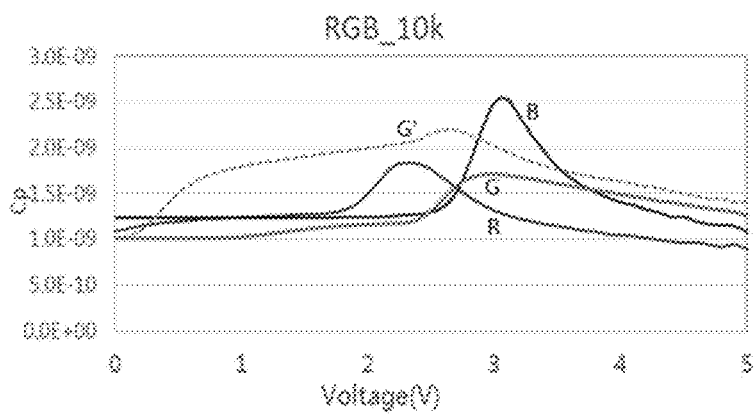
FIG. 21 is a schematic diagram showing a comparison among capacitances of light emitting layers in light emitting devices of different colors.

Specifically, the light emitting device D includes: the red light emitting device, the green light emitting device, and the blue light emitting device; the buffer capacitor C2 includes: a first buffer capacitor connected to the red light emitting device, a second buffer capacitor connected to the green light emitting device and a third buffer capacitor connected to the blue light emitting device. FIG. 21 is a schematic diagram showing a comparison of capacitances of light emitting layers in light emitting devices of different colors. As shown in FIG. 21, a capacitance of the light emitting layer in the green light emitting device is greater than that in the red light emitting device, and a capacitance of the light emitting layer in the red light emitting device is greater than that in the blue light emitting device, and a magnitude of the buffer capacitor may be set to be inversely proportional to the capacitor of the light emitting layer of the corresponding pixel. For example: a capacitance value of the third buffer capacitor may be set to be greater than that of the first buffer capacitor, which is in turn greater than that of the second buffer capacitor, so that it can be ensured that the ratio of the number of the electrons to the number of the holes of the light emitting devices of different colors is unchanged. In this way, it can be ensured that the brightness of the light emitting device D is not affected by the temperature, the color shift problem, which is caused by a change of a recombination center due to the high-temperature reliability test for the display panel, can be avoided, and the display effect of the display panel can be improved.

In a second aspect, embodiments of the present disclosure provide a display apparatus, where the display apparatus includes a plurality of display panels provided in any of the above embodiments, and the display apparatus may specifically be: any product or component with a display function, such as a mobile phone, a tablet computer, a television, a display, a notebook computer, a digital photo frame, a navigator, etc., and the implementation principle and the beneficial effect of are the same as those of the display panel, and are not described herein again.

It should be understood that the above embodiments are merely exemplary embodiments adopted to explain the principles of the present disclosure, and the present disclosure is not limited thereto. It will be apparent to one of ordinary skill in the art that various changes and modifications may be made therein without departing from the spirit and scope of the present disclosure, and such changes and modifications also fall within the scope of the present disclosure.

What is claimed is:

1. A display panel, comprising: a plurality of sub-pixel units and a voltage control module; wherein the plurality of sub-pixel units comprise a plurality of light emitting devices, respectively; and
   wherein the voltage control module is connected to an anode of a corresponding light emitting device of the plurality of light emitting devices, and is configured to control an anode voltage of the corresponding light emitting device, so that a ratio of the number of electrons to the number of holes of each light emitting device is unchanged at different gray scales.

2. The display panel according to claim 1, wherein the anode voltage is a pulse signal with first voltages and second voltages which are alternated; and
   as for the anode voltage, a first voltage duration of each of the first voltages and a second voltage duration of each of the second voltages are different in the sub-pixel units of different colors.

3. The display panel according to claim 2, wherein the plurality of sub-pixel units comprise: red sub-pixel units, green sub-pixel units and blue sub-pixel units;
   in each of the red sub-pixel units, the first voltage duration is 2.9 to 3.1 times of the second voltage duration;
   in each of the green sub-pixel units, the first voltage duration is 0.9 to 1.1 times of the second voltage duration; and
   in each of the blue sub-pixel units, the first voltage duration is 1.2 to 1.4 times of the second voltage duration.

4. The display panel according to claim 1, wherein the anode voltage is a pulse signal with second voltages and first voltages which are alternated; and
   as for the anode voltage, a first voltage amplitude of each of the first voltages and a second voltage amplitude of each of the second voltages are different in the sub-pixel units of different colors.

5. The display panel according to claim 4, wherein the plurality of sub-pixel units comprise: red sub-pixel units, green sub-pixel units and blue sub-pixel units;
   in each of the red sub-pixel units, the first voltage amplitude is 2.9 to 3.1 times of the second voltage amplitude;
   in each of the green sub-pixel units, the first voltage amplitude is 0.9 to 1.1 times of the second voltage amplitude; and
   in each of the blue sub-pixel units, the first voltage amplitude is 1.2 to 1.4 times of the second voltage amplitude.

6. The display panel according to claim 1, wherein the anode voltage is a pulse signal with second voltages and first voltages which are alternated; and in the sub-pixel units of different colors, the first voltage and the second voltage of the anode voltage have a same duration and a same amplitude, and a part of the light emitting devices are turned off.

7. The display panel according to claim 6, wherein the plurality of sub-pixel units comprise: red sub-pixel units, green sub-pixel units and blue sub-pixel units; and the light emitting devices in a part of the red sub-pixel units and a part of the green sub-pixel units are turned off, or only the light emitting devices in a part of the green sub-pixel units are turned off.

8. The display panel according to claim 1, wherein the anode voltage is provided from a power voltage terminal and an initialization signal terminal.

9. The display panel according to claim 1, wherein the light emitting device comprises: an anode and a cathode opposite to each other; a hole transport layer, an electron blocking layer, a light emitting layer, a hole blocking layer and an electron transport layer between the anode and the cathode and arranged along a direction from the anode to the cathode; the light emitting device further comprises: an exciton blocking layer; and the exciton blocking layer is between the electron blocking layer and the light emitting layer.

10. The display panel according to claim 9, wherein a material of the exciton blocking layer and a material of the electron blocking layer are mixed in a same layer.

11. The display panel according to claim 9, wherein the electron blocking layer comprises: a first electron blocking layer and a second electron blocking layer; and the second electron blocking layer is used as the exciton blocking layer; and a material of the first electron blocking layer and a material of the second electron blocking layer are mixed in a same layer as the exciton blocking layer.

12. The display panel according to claim 1, wherein the light emitting device comprises: an anode and a cathode opposite to each other; a hole transport layer, an electron blocking layer, a light emitting layer, a hole blocking layer and an electron transport layer between the anode and the cathode and arranged along a direction from the anode to the cathode; the light emitting device further comprises: an exciton blocking layer; and the exciton blocking layer is between the hole blocking layer and the light emitting layer.

13. The display panel according to claim 12, wherein a material of the exciton blocking layer and a material of the hole blocking layer are mixed in a same layer.

14. The display panel according to claim 12, wherein the hole blocking layer comprises: a first hole blocking layer and a second hole blocking layer; and the second hole blocking layer is used as the exciton blocking layer; and a material of the first hole blocking layer and a material of the second hole blocking layer are mixed in a same layer as the exciton blocking layer.

15. The display panel according to claim 9, wherein the light emitting layer comprises: a first light emitting layer and a second light emitting layer; and one of the first emitting layer and the second light emitting layer is used as the exciton blocking layer; and a material of the first light emitting layer and a material of the second light emitting layer are mixed in a same layer as the exciton blocking layer.

16. The display panel according to claim 9, wherein the light emitting devices comprise: a red light emitting device, a green light emitting device, and a blue light emitting device;

in the red light emitting device, a ratio of an electron mobility to a hole mobility of a material of the exciton blocking layer is 600:1;

in the green light emitting device, a ratio of an electron mobility to a hole mobility of a material of the exciton blocking layer is 200:1; and in the blue light emitting device, a ratio of an electron mobility to a hole mobility of a material of the exciton blocking layer is 1:1000.

17. The display panel according to claim 16, wherein in the red light emitting device, the exciton blocking layer has a highest occupied molecular orbital level in a range of 5.6 eV to 5.7 eV and a lowest unoccupied molecular orbital level in a range of 2.3 eV to 2.2 eV;

in the green light emitting device, the exciton blocking layer has a highest occupied molecular orbital level in a range of 5.5 eV to 5.6 eV and a lowest unoccupied molecular orbital level in a range of 2.5 eV to 2.4 eV; and in the blue light emitting device, the exciton blocking layer has a highest occupied molecular orbital level in a range of 5.4 eV to 5.5 eV and a lowest unoccupied molecular orbital level in a range of 2.4 eV to 2.3 eV.

18. The display panel according to claim 1, wherein the sub-pixel unit further comprises: a pixel driving circuit and a buffer capacitor; and one terminal of the buffer capacitor is connected to the pixel driving circuit, and the other terminal of the buffer capacitor is connected to the anode of the light emitting device; and the light emitting devices comprises: a red light emitting device, a green light emitting device, and a blue light device; as for the red light emitting device, the buffer capacitor comprises a first buffer capacitor connected to the red light emitting device; as for the green light emitting device, the buffer capacitor comprises a second buffer capacitor connected to the green light emitting device; as for the blue light emitting device, the buffer capacitor comprises a third buffer capacitor connected to the blue light emitting device;

a capacitance value of the third buffer capacitor is greater than that of the first buffer capacitor; and the capacitance value of the first buffer capacitor is greater than that of the second buffer capacitor.

19. The display panel according to claim 1, wherein the display panel further comprises: a plurality of detection modules; and each of the plurality of detection modules is configured to detect at least one of a brightness, a gray scale or a temperature of a region where a corresponding sub-pixel unit is located.

20. A display apparatus, comprising the display panel according to claim 1.

* * * * *